United States Patent [19]

Kuwabara et al.

[11] Patent Number: 5,126,784
[45] Date of Patent: Jun. 30, 1992

[54] IMAGE FORMING APPARATUS

[75] Inventors: Satoru Kuwabara, Chiryu; Naoyuki Hatta, Gamagori; Michitoshi Akao, Nagoya, all of Japan

[73] Assignee: Brother Kogyo Kabushiki Kaisha, Nagoya, Japan

[21] Appl. No.: 446,684

[22] Filed: Dec. 6, 1989

[30] Foreign Application Priority Data

Dec. 9, 1988 [JP] Japan .................. 63-160494[U]
Apr. 13, 1989 [JP] Japan .................. 1-93650

[51] Int. Cl.⁵ ............................................. G03B 27/32
[52] U.S. Cl. ........................................ 355/27; 355/41
[58] Field of Search .................. 355/27, 28, 32, 37, 355/38, 40, 41; 430/138

[56] References Cited

U.S. PATENT DOCUMENTS

| | | |
|---|---|---|
| 4,410,265 | 10/1983 | Ovshinsky . |
| 4,437,742 | 3/1984 | Taniguchi . |
| 4,685,786 | 8/1987 | Iida et al. . |
| 4,728,996 | 3/1988 | Matsumoto . |
| 4,736,215 | 4/1988 | Hudspeth et al. . |
| 4,782,365 | 11/1988 | Takagi . |
| 4,920,376 | 4/1990 | Sonoda .................. 355/38 |
| 4,982,224 | 1/1991 | Yamamoto et al. .......... 355/27 |

FOREIGN PATENT DOCUMENTS

| | | |
|---|---|---|
| 389493 | 3/1933 | United Kingdom . |
| 906812 | 9/1962 | United Kingdom . |
| 1095473 | 12/1967 | United Kingdom . |
| 1179318 | 1/1970 | United Kingdom . |
| 2086065 | 5/1982 | United Kingdom . |
| 2211631 | 1/1989 | United Kingdom . |

Primary Examiner—L. T. Hix
Assistant Examiner—Khanh Dang
Attorney, Agent, or Firm—Oliff & Berridge

[57] ABSTRACT

An image forming apparatus for feeding a photosensitive recording sheet having a leader on which characteristic information for the photosensitive recording sheet, such as exposure and development characteristics, is recorded. The apparatus having the capability to read the characteristic information and mechanisms for performing exposure, development and other processes on the basis of the read-out characteristic information, the capability comprising plural rollers disposed spacedly away from one another along a sheet feeding path for feeding the photosensitive recording sheet along the sheet feeding path and a detector disposed between two rollers of the plural rollers for reading out the characteristic information on the leader.

12 Claims, 5 Drawing Sheets

IMAGE FORMING APPARATUS

BACKGROUND OF THE INVENTION

This invention relates to an image forming apparatus for automatically reading out information on characteristics of a photosensitive recording sheet and performing exposure and development processes on the basis of the information.

A photosensitive recording sheet which has been used in a conventional image forming apparatus has various characteristics such as a photosensitive characteristic, a development characteristic and so on. These characteristics are varied in accordance with a process for manufacturing the photosensitive recording sheet, a raw material for the photosensitive recording sheet, and a kind of the photosensitive recording sheet. Accordingly, photosensitive recording media which have been manufactured by various makers have different characteristics and therefore different optimum conditions for the exposure, development and the other processes from one another. This difference in optimum conditions between the photosensitive recording media requires an user to beforehand input to the image forming apparatus data on the optimum conditions specified by each of the makers manually, for example, using a keyboard. However, the manual operation of the user for inputting the data on the exposure, development and the other processes in the image forming apparatus is very complicated and therefore an input error is easily induced. Accordingly, there is a possibility in the conventional image forming apparatus that an image is not formed.

In view of the above disadvantage of the conventional image forming apparatus, the applicant of this application has proposed a detection mechanism in which a photosensitive recording sheet is provided at a leading end thereof with a leader on which information on the exposure, development and the other characteristics of the photosensitive recording sheet is printed in a bar code pattern, the information on the leader is read out by a sensor and the exposure, development and the other processes are carried out in the image forming apparatus in accordance with the read-out information. In this detection mechanism, the information on the leader is read out at a sheet outlet of a cartridge for accommodating a roll type of photosensitive recording sheet while the photosensitive recording sheet is automatically fed through the sheet outlet. That is, one end of the photosensitive recording sheet, a free end of the leader, is not supported and therefore the leader itself is unstably placed in a read-out region in a read-out operation. Accordingly, a focusing for reading out the information is difficult to be set and there is a possibility that a reading error occurs because of slack or chattering of the leader.

SUMMARY OF THE INVENTION

An object of this invention is to provide an image forming apparatus in which characteristic information on a leader of a photosensitive recording sheet is accurately and simply read out without reading error, thereby accurately forming an image on the photosensitive recording sheet.

The above object is attained by provision of an image forming apparatus in which a photosensitive recording sheet is provided with a leader for recording thereon characteristic information of the photosensitive recording sheet and, an exposure process for irradiating the photosensitive recording medium with light from an original, a development process and other processes are performed on the basis of the read-out characteristic information, the apparatus comprising plural rollers disposed spacedly away from one another along a sheet feeding path for feeding the photosensitive recording sheet along the sheet feeding path and detecting means disposed between two rollers of the plural rollers for reading out the characteristic information on the leader.

DETAILED DESCRIPTION OF THE INVENTION

The preferred embodiments of this invention will be described hereunder with reference to the accompanying drawings.

Figure 1:
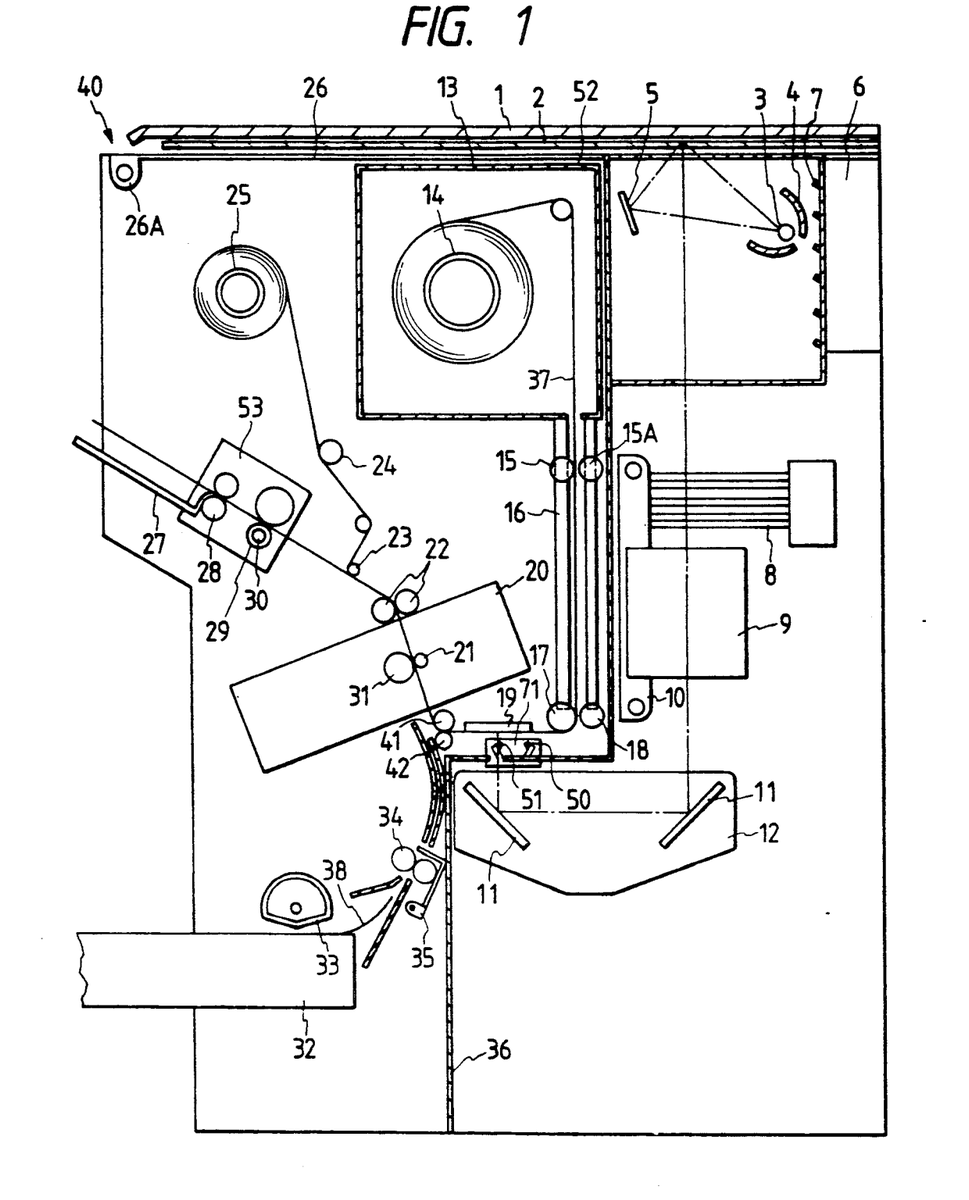
FIG. 1 shows a full-color copying machine including a roll type of photosensitive recording sheet having a leader on which characteristic information such as exposure, development and other characteristics are recorded, for example, in a bar code pattern.

FIG. 1 shows a full-color copying machine including a roll type of photosensitive recording sheet having a leader 37A on which characteristic information such as exposure, development and other characteristics are recorded, for example, in a bar code pattern. This copying machine employs a transfer type image recording sheet including a microcapsule sheet 37 and a developer sheet 38. Processing after the characteristic information is read out is described in U.S. patent application Ser. No. 291,618 filed on Dec. 29, 1988, now U.S. Pat. No. 4,982,224 and therefore the description thereof is eliminated.

As shown in FIG. 1, the copying machine 40 includes an exposure stand 19 and a pressure developing unit 20. Further, a light shielding cover plate 36 is disposed in the apparatus to spacedly divide the apparatus into an optical system and other requisite units. The elongated microcapsule sheet(photosensitive sheet) 37 having the leader 37A at the leading end thereof is wound around a cartridge shaft 14, and is retained in a photosensitive sheet cartridge 52 that is detachably disposed at a position immediately below an original support stand glass 2. In other words, the cartridge 52 storing therein non-light exposed photosensitive sheet 37 is positioned at an upper portion of the apparatus 40. The exposure stand 19 is disposed below the sheet cartridge 52 at a downstream side thereof. When a used photosensitive recording sheet 37 is exchanged for a new one, a leader 37A of the new sheet 37 passes through a number of rollers constituting sheet feeding means of this invention and the pressure developing unit 20, and is attached to a take-up shaft 25 positioned beside the sheet cartridge 52.

Between the sheet cartridge 52 and the exposure stand 19, a feed roller 15 and a barrel roller 17 are rotatably provided at a vertical sheet path 16 to guide travel of the sheet toward the exposure stand 19. At the downstream side of the exposure stand 19, there is provided a driving roller 41 and a pressure developing unit 20 which includes a small diameter(pressure) roller 21 and a backup roller 31. In the sheet feeding path, nip rollers 15A, 18 and 42 are provided such that those rollers are contacted with the feed roller 15, the barrel roller 18 and the driving roller 41, respectively by a link mechanism (not shown) when the sheet 37 and the leader 37A are automatically fed to the take-up shaft 25. Preferably, the barrel roller 17 and the driving roller 41 are disposed nearby the exposure stand 19.

At a lower portion of the apparatus 40, there is provided a developer sheet cassette 32 for storing therein a stack of developer sheets 38. Immediately above the cassette 32, a sector roller 33 is provided to feed the developer sheets 38 toward the pressure developing unit 20 one by one. Between the cassette 32 and the pressure developing unit 20, a roller 34 and a resist-gate 35 are provided so as to align the leading edge of the developer sheet 38.

At the downstream side of the pressure developing unit 20, a pair of feed rollers 22 are provided so as to provide constant running speed of the photosensitive sheet 37. This speed is coincident with a horizontally moving speed of the original support stand glass 2.

At the downstream side of the feed rollers 22, a separation roller unit 23 which provides a meandering sheet pass is provided at which the photosensitive sheet 37 is separated from the developer sheet 38. The separate photosensitive sheet 37 is taken-up by the above mentioned take-up shaft 25 through a meander travel control roller 24. On the other hand, a heat-fixing unit 53 is provided at the downstream side of the separation roller 23. The heat-fixing unit 53 includes a heating unit for heating the developer sheet 38 carrying an output color image. Further, a discharge tray 27 is provided at the downstream side of the heat-fixing unit 53.

As shown in FIG. 1, the copying machine 40 has its top plate portion provided with a stand cover 1 and the original support stand glass 2. The original support stand glass 2 is formed of light transmissive material and is movable in the horizontal direction and on which a desired original (not shown) is to be placed. Further, an inner cover 26 is hingedly supported to a main frame 26a. At the upper one side section (right side in FIG. 1) of the copying machine 40, fixedly provided is a light source including a linear halogen lamp 3 extending in the direction perpendicular to the moving direction of the original support stand glass 2, and a semi-cylindrical reflector 4 disposed to surround the lamp 3. The light source emits a linear-line light ray to the original support stand glass 2.

Therefore, the light emitted from the halogen lamp 3 can be sequentially irradiated on the entire surface over the region from one to other end of the original support stand glass 2 in accordance with the horizontal movement of the glass 2. The light from the light source passes through the transparent original support stand glass 2 and is reflected at the original mounted thereon. The original support stand cover 1 which covers the top surface of the glass 2 is provided to prevent light from leaking from the apparatus.

To irradiate the light from the halogen lamp 3 on the original at a high efficiency, a flat reflector 5 is disposed on one side of the light source. The second reflector 5 is adapted to reflect direct light which is not directed toward the original from the light source to concentrate such reflected light onto the original.

At another side of the halogen lamp 3 there are provided a fan 6 and a louver 7 for introducing an external air into the apparatus. Accordingly, air is effectively impinged onto the light source 3 to cool the same.

A filter 8 is disposed below the original support stand glass 2. Further, a lens 9 is provided below the filter 8. Light emitted from the halogen lamp 3 and reflected at the original placed on the original support stand glass 2 passes through the filter 8 and enters the lens 9. The filter 8 alters the light transmissive characteristic in accordance with the sensitivity characteristics of the photosensitive sheet 37, to thereby adjust the color tone of a copied output image. The lens 9 is fixedly secured to a lens mounting plate 10, and fine angular adjustment of this lens with respect to a light path is achievable. A pair of reflection mirrors 11 are provided below the lens 9. The condensed light passing through the lens 9 change is changed in direction by 180 degrees (completely reverses direction) by the two reflection mirrors 11 and the thus oriented light impinges on the photosensitive sheet 37 closely contacting the bottom of the exposure table 19 to form the latent image thereon. The two reflection mirrors 11 are fixedly mounted to a mirror mounting plate 12, so that the adjustment of the length of the light path and focusing adjustment can be effected by fine adjustment of the position of the mirror mounting plate 12. The construction and the operation of the above copying machine is described in detail in the copending U.S. application No. 395,359 filed on Aug. 17, 1989 the in U.S. PTO and which is commonly assigned by the assignee of this application.

In this embodiment a peripheral speed of the driving roller 41 is set to be larger than that of the barrel roller 17, so that the leader 37A of the photosensitive recording sheet 37 is suspended under tension between the driving roller 41 and the barrel roller 17. Further, a detector 71 comprising a light emitting element 50 such as a light-emitting diode for emitting light to the leader 37A and a photoreceptor 51 such as a phototransistor for detecting light reflected from the leader 37A is provided below the exposure stand 19 in such a manner as to confront the leader 37A. The light emitting element 50 and the photoreceptor 51 are embedded in the upper portion of the detector 71 and electrically connected to a control unit 54 as described below. The detector 71 is, for example, a reflection type bar code reader. Accordingly, the leader 37A is read out in front of the detector 71 while suspended under tension by the driving roller 41 and the barrel roller 17.

Figure 2:
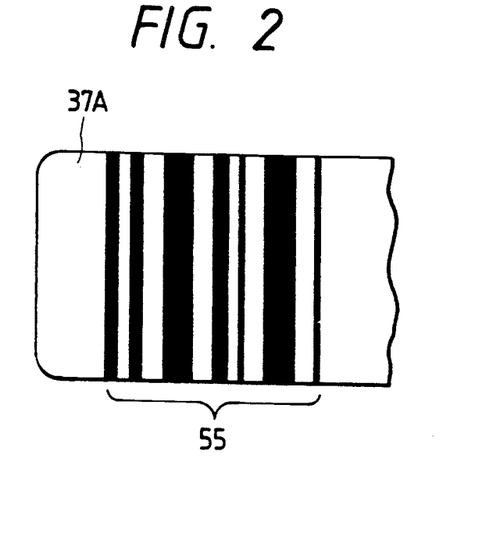
FIG. 2 shows a bar code pattern printed on the leader of the photosensitive recording medium.

As shown in FIG. 2, the leader 37A is printed thereon with a bar code 55 representing the characteristic information for the exposure, development and the other processes such as a sensitivity information, a lot information and the other information concerning of the photosensitive recording sheet.

The photosensitive recording sheet 37 taken is fed from of the cartridge 52 by the feed rollers 15 and guided by the barrel roller 17 through the vertical sheet path 16. The photosensitive recording sheet 37 then passes in contact with a lower face of the exposure stand 19 where original image carrying light is applied to the photosensitive recording sheet 37, so that a latent image is formed on the photosensitive recording sheet 37. In this case, the leader 37A of the photosensitive recording sheet 37 is fed at a higher peripheral speed by the driving roller 41 and the nip roller 42 than at a peripheral speed at which the photosensitive recording sheet 37 is fed by the barrel roller 17 and the nip roller 18, so that the leader 37A of the photosensitive recording sheet 37 is constantly suspended under tension over the full length thereof between all of the rollers and is stably placed between the exposure stand 19 and the detector 71. Accordingly, light emitted from the light emitting element 50 is stably reflected from the surface of the leader 37A and is stably incident to the photoreceptor 51, so that the bar code printed on the leader 37A is accurately detected without error.

Figure 3:
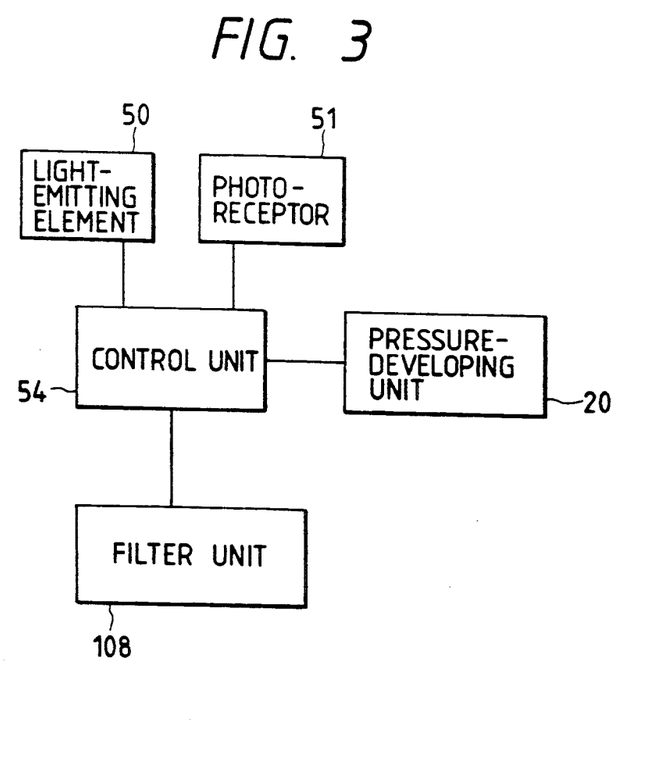
FIG. 3 is a block diagram for a control operation of the image forming apparatus.

As shown in FIG. 3, upon detection of the light reflected from the leader 37A, the detector 71 outputs a signal representing the information to the control unit 54 for processing an input signal. The control unit 54 controls a filter unit 108 used for color balance adjustment so that a filter density of the filter unit is suitable for the photosensitive recording sheet presently used in the image forming apparatus when a latent image is formed on the photosensitive recording sheet 37. Further, the control unit 54 controls a pressure-developing unit 20 for closely contacting the photosensitive recording sheet 37 with a developer sheet under pressure and forming an image on the developer sheet so that the pressure supplied by the pressure-developing unit 20 is suitable for the lot of the photosensitive recording sheet 37.

In the above embodiment, the detector has only a function for detecting the light reflected from the leader, that is, reading out only the characteristic information on the leader. However, the detector 71 may be used as both a light shielder and a detector.

Figure 4:
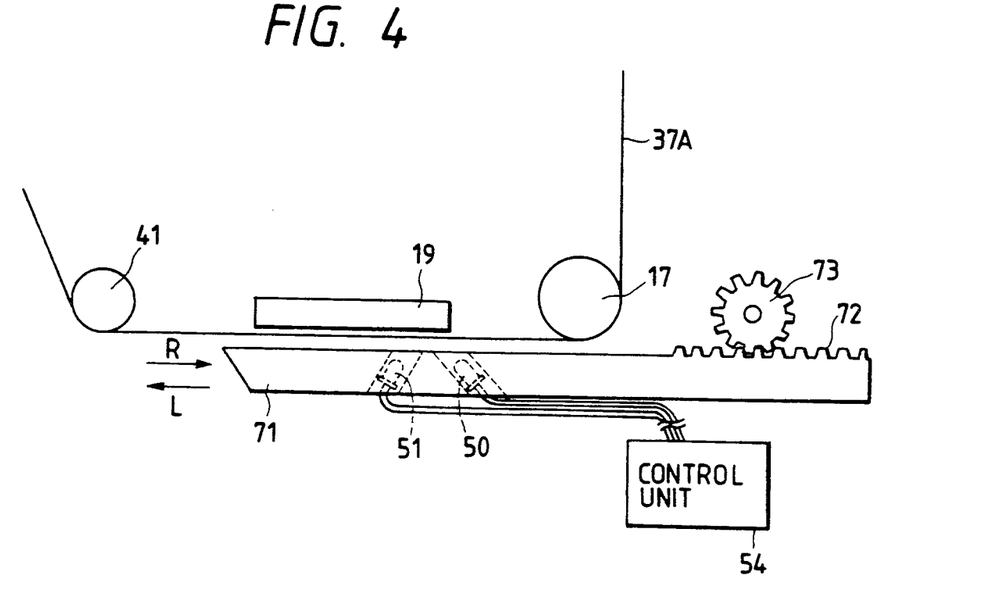
FIG. 4 shows a concrete structure of an embodiment of the detector used in the image forming apparatus.

FIG. 4 shows another embodiment of the detector 71 used in the image forming apparatus. In this embodiment, the detector 71 functions as both of a shielding shutter for preventing light from an original from being applied to the photosensitive recording sheet and a detector for reading out the information on the leader.

As shown in FIG. 4, the detector 71 of this embodiment has a rack 72 formed on the upper surface thereof and a rotatable pinion 73 is engaged with the rack 72. The pinion 73 is rotated by a motor (not shown), and the detector 71 is slidably moved between a shielding position and a non-shielding position in accordance with a rotational movement of the pinion 73. At the shielding position, the detector 71 interrupts a light reflected from the reflection mirrors 11 and prevents the light from being applied to the photosensitive recording sheet 37, while at the non-shielding position, the detector 71 is away from an optical path of the reflected light and the reflected light is allowed to be applied to the photosensitive recording sheet 37.

At an initial step of a feeding operation of a new photosensitive recording sheet for which an used one has been just exchanged, the detector 71 is moved in a direction as indicated by an arrow L in accordance with the rotational movement of the pinion 73 and stopped at the shielding position. Thereafter, the photosensitive recording sheet 37 having the leader 37A as shown in FIG. 2 is automatically fed through the sheet feeding means to the taken up shaft 25. When the leader 37A is passed through a gap between the exposure stand 19 and the detector 71, the light-emitting element 50 emits light to the sheet 37 and the photoreceptor 51 detects the light reflected from the leader 37A. The information recorded on the leader 37A is converted into an electrical signal through the photoreceptor 51 and is applied to the control unit 54.

The detector 71 is moved in a direction as indicated by an arrow R by the operation of pushing a start button (not shown), that is, the detector 71 is moved to the shielding position at an initial step of the leader feeding operation of the rollers and then moved to the non-shielding position during copying. With the completion of a copying operation, the detector 71 is returned to the shielding position. Accordingly, even if the original support stand cover 1 is opened with carelessness, an unused photosensitive recording sheet is prevented from being exposed to light by the detector functioning as a light shield.

Figure 5:
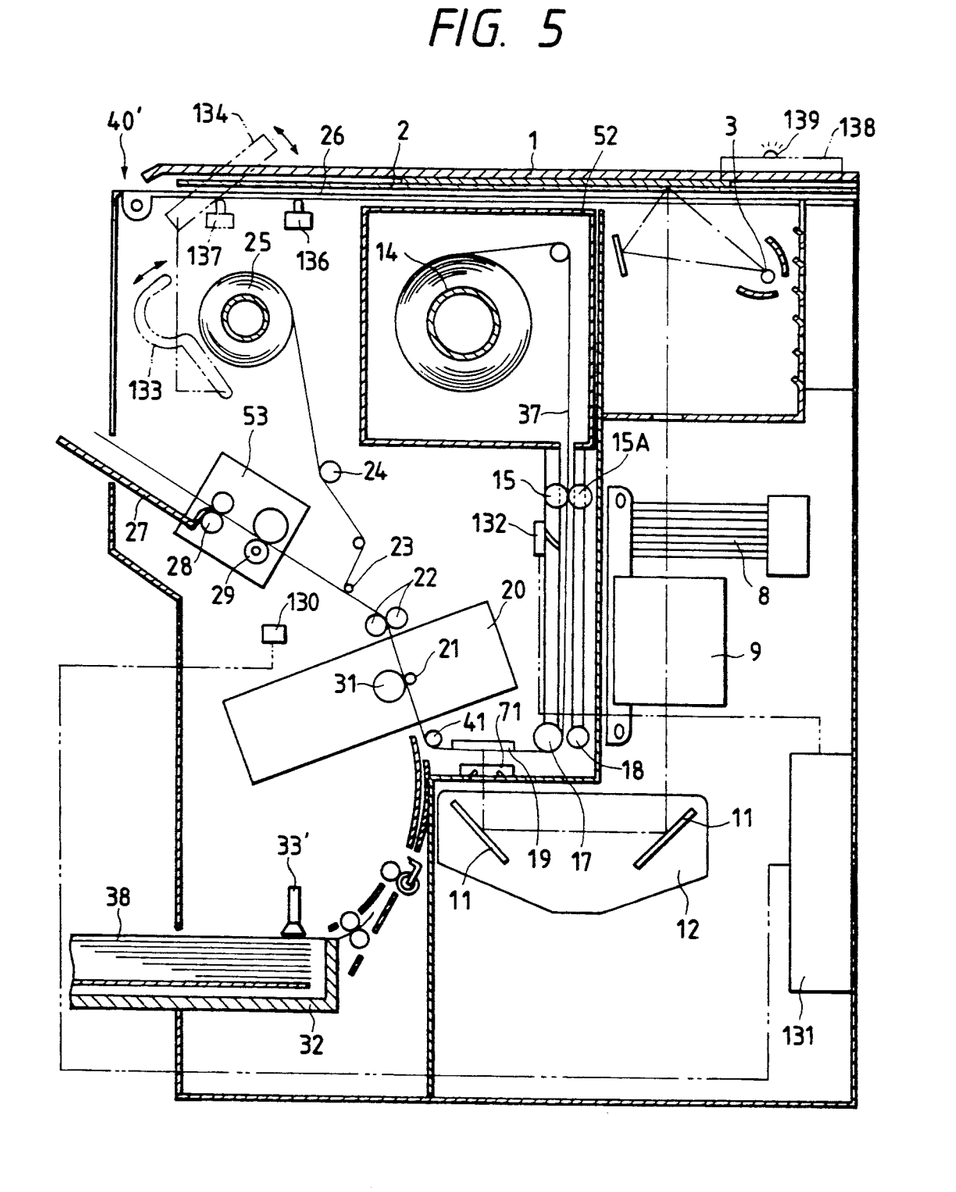
FIG. 5 shows another type of full-color copying machine containing the detector as shown in FIG. 4.

FIG. 5 shows another type of full-color copying machine containing the detector 71 as shown in FIG. 4. The copying machine 40' as shown in FIG. 5 has the substantially same construction as the copying machine as shown in FIG. 1, and the same elements as those in FIG. 1 are designated by the same reference numerals. However, the copying machine 40' is further provided with plural sensors 130, 132, 136 and 137, a controller 131 including a CPU 140, a display unit 138 containing a lamp 139, and in place of the sector roller 33, a suction cap 33' is used.

The sensor 130 is a temperature sensor for monitoring a temperature of the heat-fixing unit 53 and outputting a temperature detection signal to the controller 131. The sensor 132 is provided along the vertical sheet path and monitors whether the photosensitive recording sheet 37 is out of stock. The sensors 136 and 137 are provided below the inner cover 26. The sensor 136 detects the opening and closing of the inner cover 26, and the sensor 137 detects the action of a sheet feeding lever 134. The sheet feeding lever 134 actuates a guide member 133 to be brought into engagement with the take-up shaft 25 to guide the leader 37A provided at the leading end of the photosensitive recording sheet 37 along a gap between the take-up shaft 25 and the guide member 133 when the photosensitive recording sheet 37 is automatically fed to the take-up shaft 25 through a sheet feeding path defined by the sheet feeding means. Each of detection results of the sensors 136 and 137 is outputted as a cartridge exchange signal to the controller 131.

The feeding operation of the leader in the copying machine when an used roll sheet of photosensitive recording sheet is exchanged for a new one will be described below.

Figure 6:
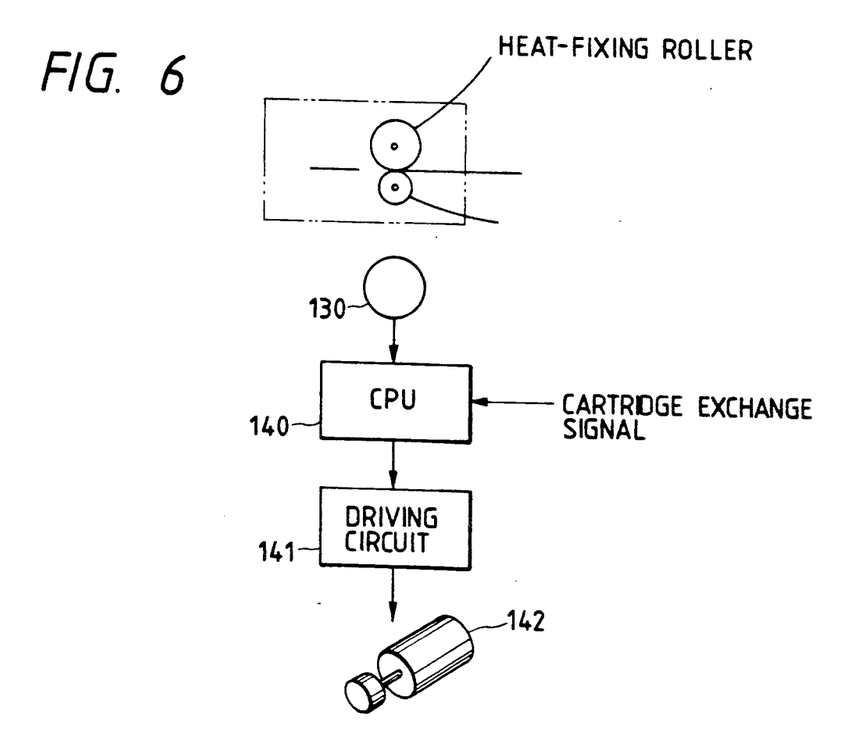
FIG. 6 is a block diagram for a sheet feeding operation in the copying machine as shown in FIG. 2.

FIG. 6 is a schematic view for explaining a sheet(-leader) feeding operation in the copying machine as shown in FIG. 5.

When a heat roller 29 of the heat-fixing unit 53 is not switched to an ON-state and thus the heat-fixing unit 53 is not normally operated, the temperature sensor 30 outputs to the CPU 140 a low-temperature signal representing that the temperature of the heat roller 29 is low. In response to the low-temperature signal from the temperature sensor 30, the CPU 140 supplies a stop signal to a driving circuit 141 in a main driving system including a main driving motor 142 for performing a copying operation of the copying machine to thereby stop the driving of the main driving motor 142.

Immediately after the used photosensitive recording sheet 37 is exchanged for a new one, the sensor 130 erroneously outputs a low-temperature signal irrespective of the heat roller 29 being in the ON-state because the new photosensitive recording sheet 37 is kept in an atmosphere of low temperature before exchange of the photosensitive recording sheet 37. However, the controller 131 neglects the low-temperature signal outputted erroneously by the sensor 130 and controls the driving circuit 141 to continue the rotation of the main driving motor 142 even though the low-temperature signal is supplied to the CPU 140.

Figure 7:
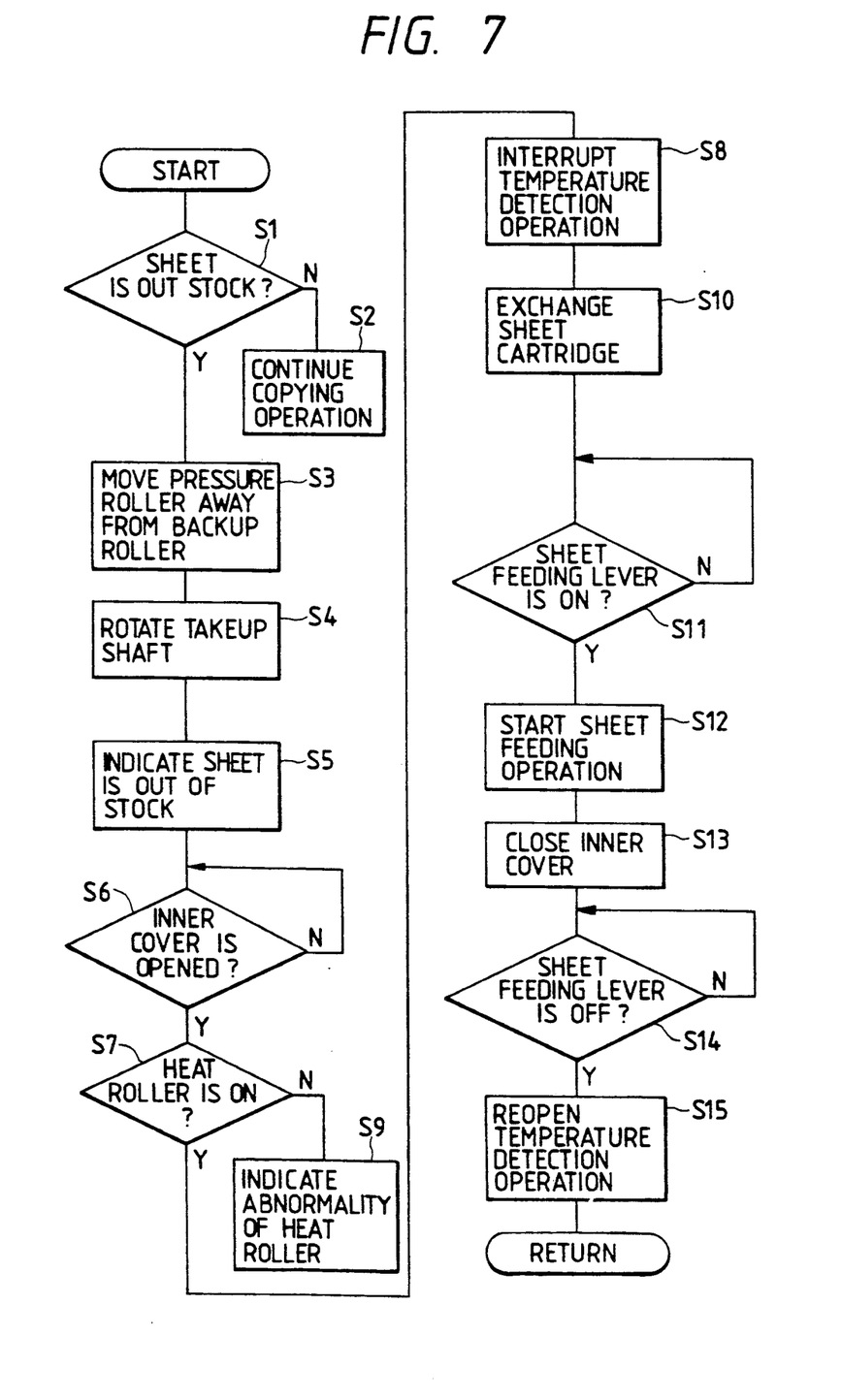
FIG. 7 is a flow chart for the sheet feeding operation as shown in FIG. 6.

FIG. 7 is a flow chart for the operation of exchanging a used photosensitive recording sheet for a new one and the feeding operation of the leader and the photosensitive recording sheet as described above.

In a step 1(S1), it is judged on the basis of the temperature signal by the CPU 140 whether the photosensitive recording sheet 37 is out of stock in the sheet cartridge 52. If it is judged that the photosensitive recording sheet 37 is not out of stock, the copying operation is continued in a step 2(S2). On the other hand, if it is judged that the photosensitive recording sheet 37 is out of stock, the pressure roller 21 of the pressure developing unit 20 is moved away from the backup roller 31 in a step 3(S3). Thereafter, the take-up shaft 25 is rotated in a step 4(S4) to wind up a tail portion of the photosensitive recording sheet 37 in the sheet cartridge 52 and the lamp 139 in the display unit 138 lights up for indicating that the photosensitive recording sheet 37 is out of stock.

Further, in a step 6(S6) it is judged by the CPU 140 on the basis of the cartridge exchange signal outputted from the sensor 136 whether the inner cover 135 is opened. If it is judged that the inner cover 135 is opened, it is subsequently judged whether the heat roller 29 is in the ON-state in a step 7(S7). If it is judged that the heat roller 29 is in the ON-state, the input of the low-temperature signal from the sensor 130 to the CPU 140 is interrupted, so that the decrease of the temperature of the heat roller 29 is neglected in a step 8(S8). On the other hand, if it is judged that the heat roller 29 is not in the ON-state, abnormality of the heat roller 29 is indicated in a step 9(S9). Next, an used sheet cartridge 52 is exchanged for a new one in a step 10(S10). In this case, a circumference of the sheet cartridge 52 is temporally cooled by the new photosensitive recording sheet 37 because the new photosensitive recording sheet 37 has been kept in an atmosphere of low temperature. Thereafter, if it is judged on the basis of the cartridge exchange signal of the sensor 137 that the automatically sheet-feeding lever 134 is in a ON-state in a step 11(S11), an automatic feeding operation starts in a step 12(S12). After the read-out of the information of the leader 37A and the feeding operation thereof are completed, any display for indicating the completion of the automatic feeding operation is made, the inner cover 26 is closed in a step 13 (S13) and the automatic sheet-feeding lever 34 is switched to an OFF-state in a step 14 (S14). After the above processes are carried out, the temperature inside the copying machine is increased by the heat roller 29 and therefore the temperature detection operation of the sensor 130 is commenced in response to the cartridge exchange signal of the sensor 137 which indicates the OFF-state of the automatically sheet-feeding lever 134 in a step 15 (S15), and the ordinary copying operation is possible.

As described above, in the image forming apparatus according to this invention, the characteristic information of the photosensitive recording sheet, which is recorded on the leader of the photosensitive recording sheet, is read out at the position below the exposure stand where the photosensitive recording sheet and the leader are sufficiently prevented from slacking, so that the information is accurately read out and an original image is accurately reproduced on the developer sheet.

What is claimed is:

1. An image forming apparatus for feeding a photosensitive recording sheet having a leader for recording characteristic information of the photosensitive recording sheet thereon along a sheet feeding path and in a sheet feeding direction, and performing an exposure process for irradiating the photosensitive recording medium with light from an original, a development process and other processes on the basis of the read-out characteristic information, comprising:

sheet feeding means comprising plural rollers disposed spacedly away from one another along the sheet feeding path for feeding the photosensitive recording sheet along the sheet feeding path; and detecting means disposed between two rollers of said plural rollers for reading out the characteristic information on the leader while the leader is tensionally suspended between said two rollers; wherein said detecting means is slidably moved between a first position and a second position, said detecting means being moved to said first position to prevent the light from the original from being applied to the photosensitive recording medium and read out the characteristic information on the leader, and being moved to said second position to allow the light from the original to be applied to the photosensitive recording medium to thereby perform the exposure process.

2. An image forming apparatus as claimed in claim 1, wherein a first roller of said two rollers is disposed downstream of a second roller of said two rollers in the sheet feeding direction, and a peripheral speed of said first roller being set to be larger than that of said second roller.

3. An image forming apparatus as claimed in claim 1, wherein said detecting means further comprises a rack formed on an upper surface thereof and a rotatable pinion engaged with said rack.

4. An image forming apparatus as claimed in claim 1, wherein said detecting means is moved to said first position at an initial step of a feeding operation of said feeding means.

5. An image forming apparatus as claimed in claim 1, wherein said detecting means comprises a light emitting element for emitting light to the leader and a photoreceptor for receiving the light reflected from the leader and outputting a signal representing the characteristic information.

6. An image forming apparatus as claimed in claim 5, further comprising a control unit for receiving the signal and controlling the exposure, development and the other processes on the basis of the characteristic information.

7. An image forming apparatus as claimed in claim 1, wherein the characteristic information is recorded in a bar code pattern on the leader.

8. An image forming apparatus as claimed in claim 1, wherein the leader is suspended under tension by said two rollers when the leader is fed in front of said detecting means.

9. An image forming apparatus as claimed in claim 8, wherein a first roller of said two rollers is disposed downstream of a second roller of said two rollers in the sheet feeding direction, and a peripheral speed of said first roller is set to be larger than that of said second roller.

10. An image forming apparatus as claimed in claim 1, further comprising an exposure stand and wherein said two rollers are disposed nearby said exposure stand, a first roller of said two rollers at an upstream side and a second roller of said two rollers at a downstream side of said exposure stand.

11. An image forming apparatus as claimed in claim 10, wherein said exposure stand is disposed at the a position opposite to said detecting means with respect to the leader.

12. An image forming apparatus for feeding a photosensitive recording sheet having a leader for recording characteristic information of the photosensitive recording sheet thereon along a sheet feeding path and in a sheet feeding direction, and performing an exposure process for irradiating the photosensitive recording medium with light from an original, a development process and other processes on the basis of the read-out characteristic information, comprising:

sheet feeding means comprising plural rollers disposed spacedly away from one another along the sheet feeding path for feeding the photosensitive recording sheet along the sheet feeding path;

detecting means disposed between two rollers of said plural rollers for reading out the characteristic information on the leader; and an exposure stand disposed at a position opposite to said detecting means with respect to the leader, said two rollers being disposed nearby said exposure stand, a first roller of said two rollers at an upstream side and a second roller of said two rollers at a downstream side of said exposure stand.

* * * * *